(12) United States Patent
Shih et al.

(10) Patent No.: US 6,620,702 B2
(45) Date of Patent: Sep. 16, 2003

(54) METHOD OF PRODUCING LOW THERMAL BUDGET HIGH DIELECTRIC CONSTANT STRUCTURES

(75) Inventors: Wong-Cheng Shih, Kaohsiung (TW); Lan-Lin Chao, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/891,440

(22) Filed: Jun. 25, 2001

(65) Prior Publication Data

US 2002/0197818 A1 Dec. 26, 2002

(51) Int. Cl.[7] .................. H01L 21/20; H01L 21/8242
(52) U.S. Cl. .................. 438/398; 438/397; 438/399; 438/776; 438/254; 438/777; 438/253
(58) Field of Search .................. 438/398, 674, 438/399, 665, 396, 776, 775, 777, 255, 253, 240, 152, 296, 404, 393, 386, 254, 397

(56) References Cited

U.S. PATENT DOCUMENTS

| | | | |
|---|---|---|---|
| 6,207,497 B1 | * | 3/2001 | Huang et al. ............... 438/253 |
| 6,337,289 B1 | * | 1/2002 | Narwankar et al. ......... 438/776 |
| 6,376,299 B1 | * | 4/2002 | Joo et al. .................... 438/240 |
| 6,458,645 B2 | * | 10/2002 | DeBoer et al. ............. 438/240 |
| 2001/0024387 A1 | * | 9/2001 | Raaijmakers et al. ....... 365/200 |

* cited by examiner

Primary Examiner—Matthew Smith
Assistant Examiner—Igwe U. Anya
(74) Attorney, Agent, or Firm—Tung & Associates

(57) ABSTRACT

Methods are presented for reducing the thermal budget in a semiconductor manufacturing process that include for instance, depositing high dielectric constant films to form MIS capacitors, where processes including plasma nitridation and oxidation and deposition processes including ALD and PVD are selectively employed to lower the overall thermal budget thereby allowing smaller structures to be reliably manufactured.

15 Claims, 2 Drawing Sheets

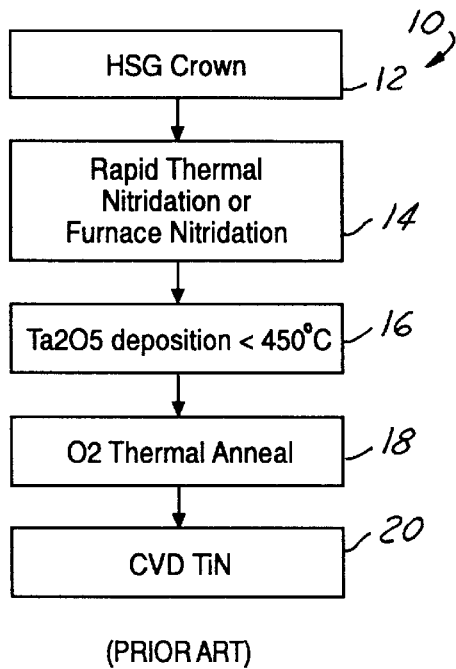
FIG. 1 (PRIOR ART)
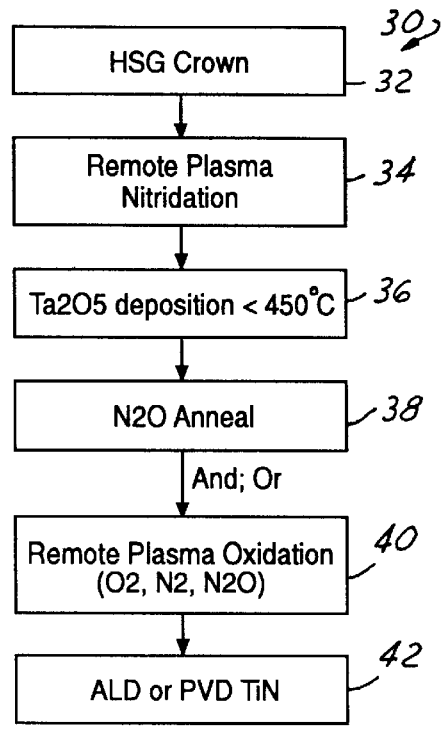
FIG. 2
| Wafer I.D. | | 3 | 21 |
|---|---|---|---|
| 52 — SCI 65°C, 20s | | * | * |
| 54 — RTNH 700°C, 300s | | * | * |
| 56 — Ta$_2$O$_5$ 450°C, 80Å | | * | * |
| 58 — RPO 475°C | 30s | * | * |
| | 60s | | |
| 60 — RTN$_2$O 700°C, 180s | | | |
| | | * | * |
| | | | |
| 62 — CVD TiN 580°C, 300Å | | * | * |
| Leakage Current @ 125°C (fA/cell) | 1V | 0.090 | 0.016 |
| | -1V | 1.013 | 0.016 |
| Capacitance (fF/cell) @ 10kHz | | 32.8 | 17.9 |
| t$_{eff}$ (Å) | | (34.3) | 33.7 |
FIG. 3

METHOD OF PRODUCING LOW THERMAL BUDGET HIGH DIELECTRIC CONSTANT STRUCTURES

FIELD OF THE INVENTION

The present invention relates generally to processing methods used for processing high dielectric constant metal oxide films and more particularly to methods with lower overall thermal budgets such that smaller generations of structures e.g., 0.15 micron may be reliably manufactured.

BACKGROUND OF THE INVENTION

The current trend of memory fabrication process for an integrated circuit includes increasing the storage density and the data storage amount on a single chip. A higher density provides a memory with a more compact storage. In addition, storing data on single chip is more economical compared to storing the equivalent amount of data on multiple chips. The density of integrated circuit can be increased via shrinkage of structures, for example, conductive lines or transistor gate, and reduction of spaces between structures. In the fabrication of integrated circuit, the shrinkage of circuit structure can be treated as a reduction of design rule.

The reduction of design rule results in a reduced substrate surface area, and consequently, the available area for fabricating the storage capacitor of a dynamic random access memory (DRAM) device is restricted. This limits the storage capacitance of the DRAM. The limitation of storage capacitance leads to problems such as mechanical deterioration and leakage current or even potential loss caused by larger dielectric susceptibility. Furthermore, the loss of storage charges caused by larger dielectric susceptibility may result in a more frequent refresh cycles. While refreshing, data accesses such as read and write operations can not be processed. Thus, a frequent refresh cycle requires a more complex data access scheme or a more sensitive charge sense amplifier. To increase the capacitance of a capacitor and to resolve the problems mentioned above, a three-dimensional capacitor has been developed. However, considerations of yield and throughput make this kind of capacitor structure complex and difficult to fabricate.

In addition to a three-dimensional capacitor, approaches including minimizing the thickness of the dielectric layer and using a dielectric layer with high dielectric constant can also achieve the objective of increasing capacitance. Many approaches have been tried using a dielectric layer with a high dielectric constant. For example, tantalum oxide ($Ta_2O_5$) with a dielectric constant three times larger than silicon nitride has been widely applied.

Dielectric films with dielectric constants higher than SiN have become necessary for scaling down dimensions in DRAM devices. The $Ta_2O_5$ dielectric film is one of the better known and well-studied materials meeting this requirement. One of the more feasible approaches in forming the type of capacitor structure required in DRAM is by the application of a Ta2O5 dielectric film on a hemispherical grain (HSG) surfaced 3-dimensional bottom electrode.

One major problem in employing tantalum oxide is the very significant leakage current. Leakage current is induced by mutual interaction between the tantalum oxide layer and a bottom electrode. Forming an oxide layer or a nitride layer acts between the tantalum oxide layer and a bottom electrode acts to block the mutual interaction, reducing leakage current. It is known that the dielectric layer is formed as a thin film between the bottom electrode and the top electrode.

Although it has been found that the $Ta_2O_5$ metal-insulator-semiconductor (MIS) can meet the requirements in terms of capacitance density and cell size, a major challenge remains in finding ways to reduce the thermal budget (i.e., the integral of device temperature T (t) over a fixed period of time) in processing the $Ta_2O_5$ MIS capacitor as structure size diminishes to 0.15 microns and beyond. C As a result, processing methods that can be performed more quickly and at lower temperatures are critical in future DRAM processing.

For example, in the case of capacitors and MOS transistors, the high dielectric metal oxide film is normally formed on a silicon surface or a nitrided silicon surface, and a high temperature oxygen anneal can cause oxygen to diffuse through the dielectric and form undesired silicon dioxide at the metal oxide/silicon nitride and/or at the silicon nitride/poly interfaces. It is to be appreciated that silicon dioxide formation at these interfaces will create a low dielectric constant film in series with the high dielectric metal oxide film thereby reducing the effective capacitance of the film.

As an example of a high thermal budget prior art process, reference is made to FIG. 1 where a flow diagram (10) depicts the prior art process of forming a $Ta_2O_5$ MIS capacitor where an HSG crown is formed on bottom electrode in (12); followed by a remote thermal nitridation (14) at temperatures of about 800 to about 1000° C. to form a thin SiN barrier layer between the HSG surface and the subsequently deposited $Ta_2O_5$ film; deposition of a $Ta_2O_5$ film (16) at a temperature less than about 450° C.; followed by a thermal anneal (18) at temperatures from about 800 to 1000° C. in the presence of oxygen; and finally a chemical vapor deposition (CVD) (20) of TiN at about 680° C.

It is therefore an object of the present invention to provide low temperature processes with a reduced thermal budget that may be used in the production of deposited metal oxide dielectric film thereby improving the interface characteristics and electrical properties of a deposited metal oxide dielectric films and making them useable in smaller generations of integrated circuit structures.

SUMMARY OF THE INVENTION

To achieve the foregoing and other objects, and in accordance with the purposes of the present invention, as embodied and broadly described herein, the present invention provides a method for reducing a thermal budget in a semiconductor manufacturing process including in one embodiment: forming a hemispherical surface crown (HSG) film over a conductive surface; subjecting said HSG film to a remote plasma nitridation treatment; forming a metal oxide film over said HSG film; thermally annealing said metal oxide film in the presence of an oxygen containing ambient; and, depositing an electrode film by a low temperature CVD process carried out at a temperature of at most about 580 degrees Centigrade.

In another embodiment according to the present invention, a method is provided for reducing a thermal budget in a semiconductor manufacturing process including the steps of: forming a hemispherical surface crown (HSG) film over a conductive surface; subjecting said HSG film to a remote plasma nitridation treatment; forming a metal oxide film over said HSG film; subjecting said metal oxide film to a plasma oxidation treatment in the presence of an oxygen containing ambient; and, depositing an electrode film by a process selected from the group consisting of atomic layer deposition, and physical vapor deposition.

Additional embodiments are presented according to the present invention where a thermal annealing and plasma oxidation step in the presence of at least $N_2O$ may be carried alternatively or additively to one another.

Yet additional embodiments include specific temperatures and materials for carrying out the steps according to the present invention.

BRIEF DESCRIPTION OF THE DRAWINGS

FIG. 1 shows a process flow diagram for producing a $Ta_2O_5$ MIS capacitor according to the prior art.

FIG. 2 shows a process flow diagram for producing a low thermal budget $Ta_2O_5$ MIS capacitor according to a preferred embodiment of the invention.

FIG. 3 lists the process steps followed for making two of the low thermal budget $Ta_2O_5$ MIS capacitors made according to the present invention.

DETAILED DESCRIPTION OF THE PREFERRED EMBODIMENT

Figure 4A:
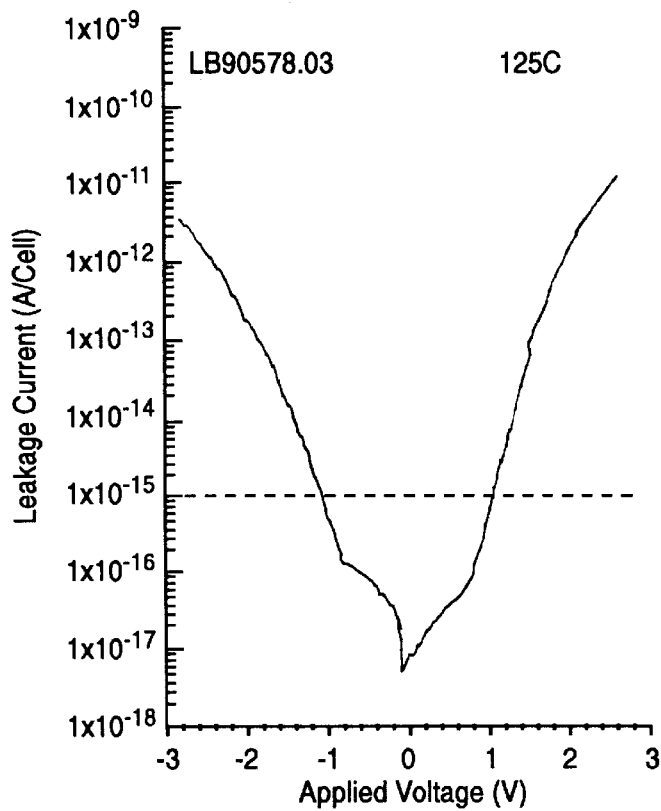
FIGS. 4(A) and (B) show leakage current versus applied voltage for two different samples of the low thermal budget $Ta_2O_5$ MIS capacitors made according to the present invention.

The present invention relates to a low thermal budget method of forming high dielectric film structures in various semiconductor devices such as, but not limited to: capacitors, transistors, interconnect structures and other like devices wherein at least one high dielectric material is required. A high dielectric material is defined as one where the dielectric constant is at least 20. A preferred use of the present invention is the formation of a $Ta_2O_5$ MIS capacitor.

A preferred embodiment according to the present invention, in contrast to FIG. 1 showing the prior art is shown in flow chart (30) in FIG. 2. After forming an HSG crown layer (32), a remote plasma nitridation process (34) is used in place of the thermal nitridation process of the prior art to form a very thin SiN barrier layer (10–20 Angstroms). This step of performing remote plasma nitridation versus thermal nitridation allows nitridation temperatures to be reduced to about 400–700° C. Plasma nitridation gives reasonable wafer uniformity (within about 5%).

As further shown in FIG. 2, following the deposition of a $Ta_2O_5$ film (36) at temperatures less than about 450° C., as in the prior art, a preferred embodiment according to the present invention substitutes the thermal (gas) anneal in the presence of oxygen with a thermal (gas) anneal treatment in the presence of $N_2O$ (38) at temperatures from about 600 to 700° C. The purpose of the annealing treatment (38) is to remove residual carbon and hydrogen in the $Ta_2O_5$ film deposited in (36). It is believed that a lower annealing temperature is made possible by the fact that active oxygen atoms can be generated from $N_2O$ at a lower temperature compared to $O_2$. For example, a gas anneal treatment at about 700° C. for three minutes is equivalent to a treatment in $O_2$ at about 800° C. for the same period of time.

Further, according to the present invention, an additional step (40) of remote plasma oxidation carried out at temperatures in the range of about 300° C. to about 500° C. may be carried out prior to the deposition of the top electrode. Such a step may advantageously be used to further oxidize and remove impurities from a high dielectric film (e.g., $Ta_2O_5$). The remote plasma oxidation process may be carried out in the presence of at least one of $O_2$ and $N_2O$. $N_2$ may be added as needed to achieve pressures needed for plasma processes as will be understood by those skilled in the art. Alternatively, the remote plasma oxidation process in the presence of at least one of $O_2$ and $N_2O$ may be carried out as a substitute for any thermal annealing process. In this case the remote plasma oxidation process according to the present invention is carried out at temperatures of about 300° C. to about 500° C. and can give comparable results to thermal oxidation processes of the prior art carried out at temperatures from about 800° C. to about 1000° C. The word "about" in this writing indicates a range of values that is within 10% of the average value given.

Finally, according to the present invention, a top electrode of, e.g., TiN, may be deposited by a low temperature CVD process (42) carried out in a temperature range of about 550 degrees Centigrade to about 580 degrees Centigrade. This low temperature CVD process is lower than the prior art CVD process for depositing TiN at about 680 degrees Centigrade. Alternatively, one may use either the low temperature process of the atomic layer deposition (ALD) technique, in the case of manufacture of a DRAM device, or alternatively, a physical vapor deposition (PVD) technique the case of manufacture of a mixed-signal device. In either case, the ALD technique (270–380° C.) or the PVD technique (less than 200° C.) according to the present invention are carried out at temperatures far lower than the CVD processes of the prior art used to deposit the top electrode (e.g., TiN).

It will be appreciated that any of the steps according to the present invention may be used alone or in combination to achieve a lower thermal budget.

The present invention is more particularly described in the following example, which is intended as illustrative only, as numerous modifications and variation will be readily apparent to those skilled in the art.

IMPLEMENTATION EXAMPLE

As an implementation example for a low thermal budget process of the present invention, the process for manufacturing a low thermal budget $Ta_2O_5$ MIS capacitor is presented: As shown with reference to FIG. 3, a surface cleaning step (52) was carried out at 65° C. for about 20 seconds; a rapid thermal nitridation step (54) in the presence of $NH_3$ was then carried out at a temperature of about 700 degrees Centigrade for about 300 seconds; a $Ta_2O_5$ film about of 80 Angstroms thickness (56) was formed at about 450 degrees Centigrade; a remote plasma oxidation (RPO) step (58) was then carried out at 475° C. for about 30 seconds; a rapid thermal annealing treatment in the presence of $N_2O$ ($RTN_2O$) (60) was carried out at about 700° C. for about 180 seconds; (6) lastly, a 300 Angstrom layer of TiN (62) was deposited by a low temperature CVD process at about 580° C.

Figure 4B:
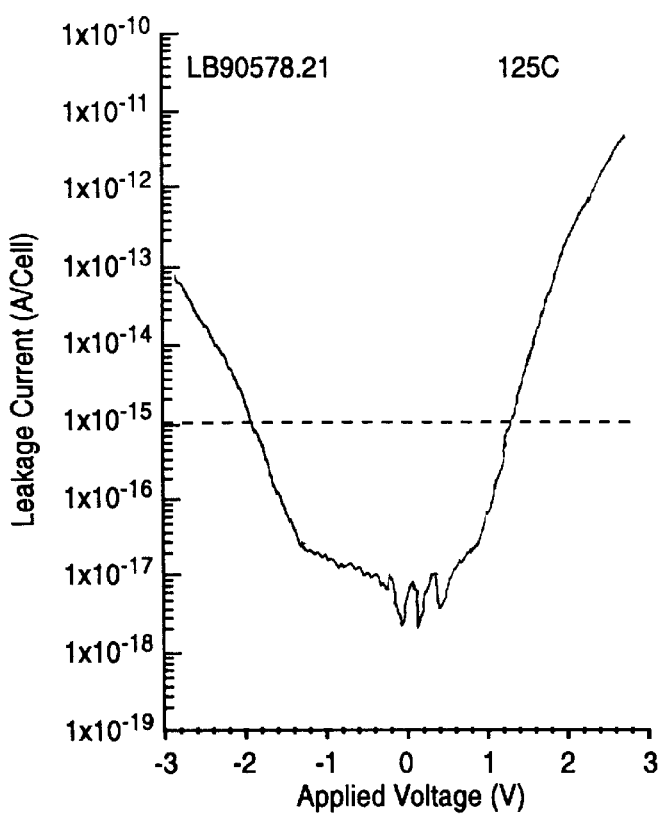

The electrical characteristics of the $Ta_2O_5$ MIS capacitors produced according to the method shown in FIG. 3 are listed in the lower portion of FIG. 3. FIGS. 4A and 4B show in more detail the leakage current versus applied voltage for samples prepared according to the low thermal budget process method shown in FIG. 3.

What is claimed is:

1. A method for reducing a thermal budget in a high dielectric constant capacitor semiconductor device manufacturing process comprising:

forming a hemispherical surface crown (HSG) film over a conductive surface;

subjecting said HSG film to a remote plasma nitridation treatment to form a silicon nitride layer;

forming a metal oxide film over said HSG film;

thermally annealing said metal oxide film in the presence of an ambient consisting primarily of N2O at a temperature less than about 700 degrees Centigrade;

depositing an electrode film by a process of atomic layer deposition carried out in a temperature range of about 270 degrees Centigrade to about 370 degrees Centigrade.

2. The method of claim 1, wherein the remote plasma nitridation treatment is carried out within a temperature range of about 400 degrees Centigrade to about 700 degrees Centigrade.

3. The method of claim 1, wherein the step of thermally annealing is carried out within a temperature range of about 600 degrees Centigrade to about 700 degrees Centigrade.

4. The method of claim 1, wherein the step of depositing an electrode film includes depositing Titanium Nitride.

5. The method of claim 1, wherein said metal oxide film is formed with a dielectric constant of at least 20.

6. The method of claim 1, wherein the step of forming said metal oxide film includes depositing Tantalum Oxide.

7. The method of claim 1, wherein following the step of thermally annealing said metal oxide film is subjected to a plasma oxidation treatment in the presence of an $N_2O$ containing ambient within a temperature range off about 300 degrees Centigrade to about 500 degrees Centigrade.

8. The method of claim 1, wherein the step of thermally annealing said metal oxide film is replaced by a plasma oxidation treatment in the presence of an $N_2O$ containing ambient within a temperature range of about 300 degrees Centigrade to about 500 degrees Centigrade to reduce a thermal budget.

9. A method for reducing a thermal budget in a high dielectric constant capacitor semiconductor device manufacturing process comprising:

forming a hemispherical surface crown (HSG) film over a conductive surface;

subjecting said HSG film to a remote plasma nitridation treatment to form a silicon nitride layer;

forming a metal oxide film over said HSG film;

thermally annealing said metal oxide film in the presence of an ambient consisting primarily of N2O at a temperature less than about 700 degrees Centigrade;

depositing an electrode film by a process of physical vapor deposition carried out at a temperature range of at most about 200 degrees Centigrade.

10. The method of claim 9, wherein the remote plasma nitridation treatment is carried out within a temperature range of about 400 degrees Centigrade to about 700 degrees Centigrade.

11. The method of claim 9, wherein the step of thermally annealing is carried out within a temperature range of about 600 degrees Centigrade to about 700 degrees Centigrade.

12. The method of claim 9, wherein atomic layer deposition is carried out within a temperature range of about 270 degrees Centigrade to about 370 degrees Centigrade.

13. The method of claim 9, wherein the step of depositing an electrode rum includes depositing Titanium Nitride.

14. The method of claim 9, wherein said metal oxide film is formed with a dielectric constant of at least 20.

15. The method of claim 9, wherein the step of forming said metal oxide film includes depositing Tantalum Oxide.

* * * * *